United States Patent [19]

Cesare et al.

[11] Patent Number: 5,177,744
[45] Date of Patent: Jan. 5, 1993

[54] METHOD AND APPARATUS FOR ERROR RECOVERY IN ARRAYS

[75] Inventors: Brian K. Cesare, Kingston; Timothy J. Slegel, Staatsburg; Darell S. Whitaker, Cottekill, all of N.Y.

[73] Assignee: International Business Machines Corporation, Armonk, N.Y.

[21] Appl. No.: 577,352

[22] Filed: Sep. 4, 1990

[51] Int. Cl.⁵ .......................................... G06F 11/10
[52] U.S. Cl. ................................... 371/10.1; 371/13
[58] Field of Search ..................... 371/10.1, 10.2, 13

[56] References Cited

U.S. PATENT DOCUMENTS

| | | | |
|---|---|---|---|
| 4,231,089 | 10/1980 | Lewine et al. | 364/200 |
| 4,326,291 | 4/1982 | Marsh et al. | 371/68 |
| 4,376,300 | 3/1983 | Tsang | 365/200 |
| 4,380,066 | 4/1983 | Spencer et al. | 371/10 |
| 4,573,146 | 2/1986 | Graham et al. | 365/200 |
| 4,581,739 | 4/1986 | McMahon, Jr. | 371/21 |
| 4,654,847 | 3/1987 | Dutton | 371/10 |
| 4,688,219 | 8/1987 | Takemae | 371/10 |
| 4,723,227 | 2/1988 | Murotani | 365/200 |
| 4,731,758 | 3/1988 | Lam et al. | 365/189 |
| 4,768,193 | 8/1988 | Takemae | 371/10 |
| 4,802,117 | 1/1989 | Chrosny et al. | 364/900 |
| 4,849,978 | 7/1989 | Dishon et al. | 371/10.1 |
| 4,942,575 | 7/1990 | Earnshaw et al. | 371/10.1 |
| 5,025,418 | 6/1991 | Asoh | 365/200 |

Primary Examiner—Charles E. Atkinson
Attorney, Agent, or Firm—Michael J. Scheer; Robert L. Troike

[57] ABSTRACT

Method and apparatus for error recovery in primary storage is provided by backup storage that stores a complete copy of primary storage. When a parity error is detected, the backup storage is used to replace data in the primary storage or the parity of primary storage. This apparatus is controlled by a processor controller which makes this replacement by comparing the primary storage, backup storage, and the primary parity storage. If after re-execution of the operation errors are still detected, the processor controller copies the data from primary storage to a second storage and retries the operation.

14 Claims, 5 Drawing Sheets

METHOD AND APPARATUS FOR ERROR RECOVERY IN ARRAYS

This invention relates to storage arrays and more particularly to a method and apparatus for recovery from errors in storage arrays without the cost and complexity of using error correcting codes.

BACKGROUND OF THE INVENTION

One of the key elements in a vector processing facility is the storage array chip which make up the vector registers. These can have relatively high failure rates so it is desirable to recover from an error in one of these chips. Previous schemes used simple parity which does not permit recovery, or traditional error correcting codes (ECC). Although ECC does allow recovery after an error, it is relatively difficult to implement, requires a significant amount of logic, and tends to impact the overall design of the vector processing facility.

The method described in the present application overcomes the above stated difficulties by taking advantage of the fact that the current array chip technology provides much denser array chips and that this extra density may be used to provide a redundant copy of all data stored in the vector registers so that error recovery is possible based on this redundant data. The method described herein may be used to recover from both transient and most types of permanent errors in array chips.

U.S. Pat. No. 4,326,291 of Marsh et al. discloses an error detection system in which a redundant logic unit is provided along with a required logic unit for simultaneous operation therewith. The required logic unit and redundant unit both produce output data which, it is desired, will be the same. The output data from the required logic unit is supplied to a data bus and the output of the redundant logic unit is supplied to a parity check digit generator. From the data received from the redundant logic unit the parity check digit generator generates a parity check digit which is applied to the data bus along with the data from the required logic unit. A parity checking circuit receives the data and the parity check digit from the data bus and a calculation is made by the circuit to determine if parity is correct. If parity is not correct, the checking circuit produces an alarm to alert the user. There is considerable art relating to redundancy in the chips themselves and in the memory systems for means for keeping track of the good cells in memory chips and the bad cells. Examples of these are U.S. Pat. Nos. 4,376,300 of Tsang, 4,380,066 of Spencer et al, 4,688,219 and 4,768,193 of Takemae.

SUMMARY OF INVENTION

In accordance with one embodiment of the present invention, a method is disclosed for error recovery in primary data arrays in a system which also contains storage of parity which includes the steps of providing a backup storage which holds a complete copy of what is stored in the primary data array. All processing is stopped if a parity error is detected by logic. Further, if the data associated with the backup storage matches the parity, the data in the primary data array is replaced with that in the backup storage. In a further embodiment, if after replacement parity error is detected, the data from the backup storage is used.

DESCRIPTION ACCORDING TO PREFERRED EMBODIMENTS OF THE PRESENT INVENTION

Figure 1:
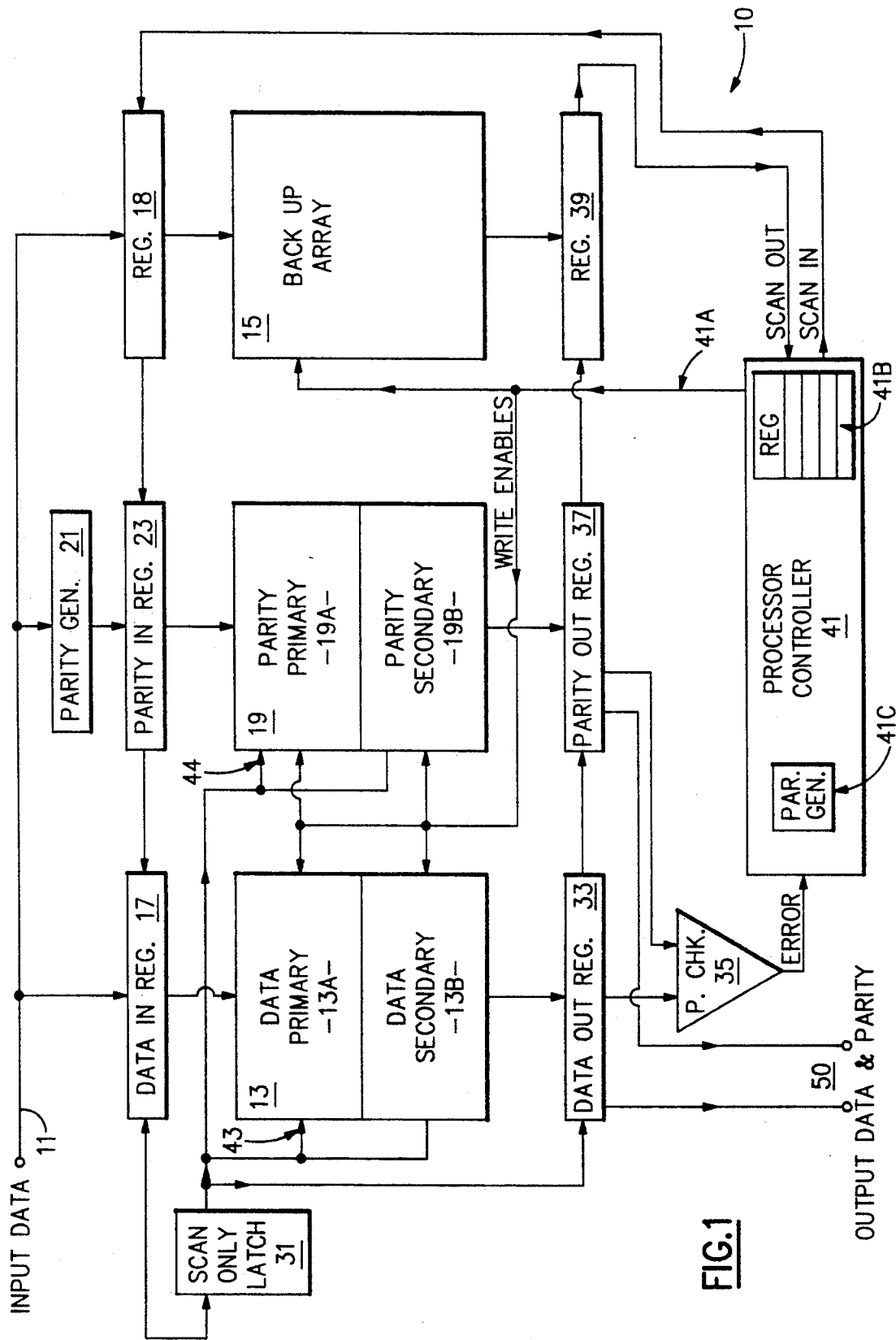
FIG. 1 is a block diagram of the storage system according to one embodiment of the present invention.
Figure 2:
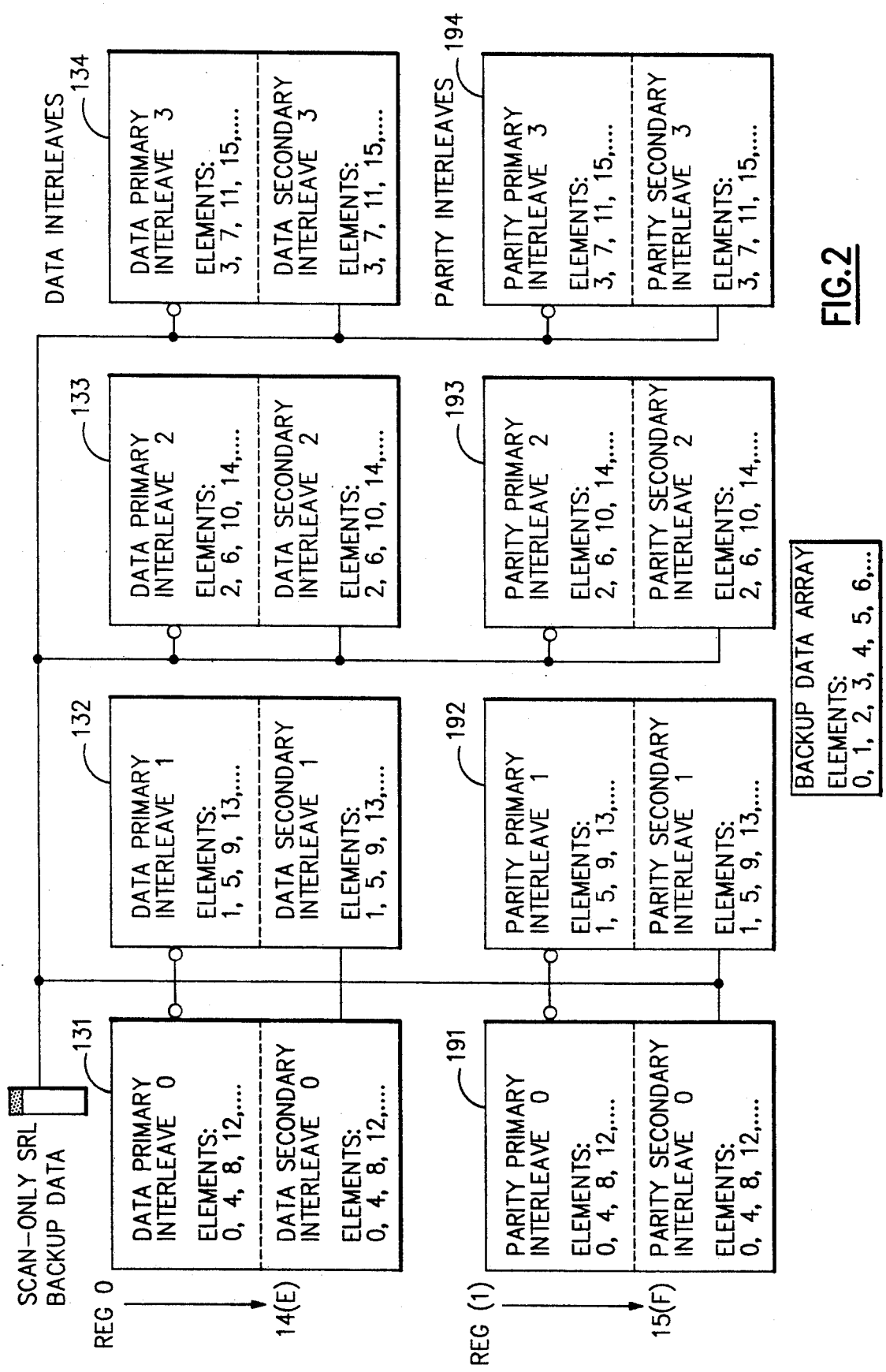
FIG. 2 is a diagram illustrating interleaving in a typical vector processing arrays of FIG. 1.

Referring to FIG. 1 there is illustrated a block diagram of the storage 10 which make up the vector registers according to the present invention for use in vector processing in a computer system. According to the present invention, the data on bus 11 is supplied via a 32-bit register 17 to primary data array 13 and also via 32-bit register 18 to backup storage on a backup array chip 15. This vector processing system has, for example, logically 16 registers each 32 bits wide and 256 elements deep. The actual physical layout of the register is distributed on the primary data array 13 which uses four interleaved storage array chips so that multiple reads and writes are possible during the same machine cycle. The primary data array 13 is made up of for example, four semiconductor array chips as shown in FIG. 2 that are for example, each 32 bits wide and 2048 deep. Referring to FIG. 2 there is a diagram of a typical layout which uses four-way interleaving consisting of four array chips for data and four array chips for parity. In the first array chip 131 portion labelled "Data Primary Interleave 0" are stored elements 0, 4, 8, 12, . . . of the registers. On the second array chip 132 portion labelled "Data Primary Interleave 1" are stored elements 1, 5, 9, 13, . . . of the same registers. On the third array chip 133 portion labelled "Data Primary Interleave 2" are stored the elements 2, 6, 10, 14 . . . of same registers. In the fourth array chip 134 portion labelled "Data Primary Interleave 3" are stored the elements 3, 7, 11, 15, . . . of the same registers. This layout allows reading from two different interleaves and writing to a third interleave in the same cycle. The input data is also provided to a four-bit parity generator 21 that provides four-bit parity to the register 23 and to the array 19 for each 32 bits. The register 23 actually stores eight four-bit parities. When a data write occurs for a particular interleave in the primary array 13 a corresponding write will be provided to the parity interleave. The first parity chip 191 portion labelled "Parity Primary Interleave 0" stores parity for stored elements 0, 4, 8 and 12 . . . ; the second parity chip 192 portion labelled "Parity Interleave 1" stores parity for stored elements 1, 5, 9, 13 . . . ; the third parity chip 193 portioned labelled "Parity Interleave 2" stores parity for stored elements 2, 6, 10, 14 . . . ; and the fourth parity chip 134 portion stores parity for stored elements 3, 7, 11, 15 . . . etc.

As stated previously, the semiconductor array chips 131–134 are for example, 32 bits wide and 2048 deep. These array chips are much denser than that normally used for vector register application. This extra density is used to provide a redundant copy of all data stored in the vector registers so that error recovery is possible based on this redundant data. The method may be used to recover from all transient and most types of permanent errors in array chips. Because only a small fraction of the total array chip area is actually used in the vector register application a second address space referred to as Secondary Data Array 13B in FIG. 1 within the same chip is made available via a scan-only latch 31 as discussed later.

During normal operation only the first address space, 13A, as indicated generally and an address space block 13A is used. This is represented by the term "Data Primary". The second address space 13B termed "Data Secondary" is four-way interleaved as in the Data Primary as shown in FIG. 2 with the first chip 131 storing redundant elements 0, 4, 8, 12 . . . ; the second chip 132 storing redundant elements 1, 5, 9, 13 . . . ; the third chip 133 storing redundant elements 2, 6, 10, 14 . . . ; and the fourth chip 134 storing redundant elements 3, 7, 11, 15 . . .

The parity array 19 likewise has a parity primary address space 19A and a parity secondary address space 19B in parity array 19. The secondary address space 19B of the parity array is four-way interleaved as shown in the primary parity address space in FIG. 2 with the first chip 191 storing redundant parity elements 0, 4, 8, 12 . . . ; the second chip 192 storing redundant parity elements 1, 5, 9, 13 . . . ; the third chip 193 storing redundant parity elements 2, 6, 10, 14 . . . ; and the fourth chip 194 storing redundant parity elements 3, 7, 11, 15 . . .

The output from the primary data array 13 is applied via register 33 to the output of the system at terminal 50 and to parity check logic 35. The parity output from the parity array 19 is applied via the parity output register 37 to parity check 35 and to terminal 50. If there is a parity error, that error signal is applied to the processor controller 41.

During normal operation every time data is written into the primary data array 13 the identical data is written into the corresponding location in the backup array 15. The backup array is a single array chip and does not have interleaves like the primary array since the data is only written into a single primary interleave during a cycle and during normal operation, data is never read out of this backup array chip. One preferred embodiment describes herein the backup array may be a single separate array chip that is 32 bits wide and 2048 deep. Also note that the backup chip holds four times as much data as the primary chips since it must be able to contain all of the data in the four different primary interleaves. This is further possible because of the above mentioned high density for these array chips. The output from the backup array 15 is stored in a 32-bit register 39. The registers 17, 18, 23, 33, 37 and 39 and scan-only latch 31 are connected in series with the processor controller 41. These devices are part of the LSSD (Level Sensitive Scan Design) system and can be scanned sequentially from the controller through the registers in the order of registers 19, 23, and 17 scan only latch 31, registers 33, 37 and 39 back to the processor controller 41. The outputs in these registers are sequentially shifted to the processor controller 41 where the data at these registers can be compared for control.

During normal operation every time data is written into the primary data arrays 13 via register 17, the identical data is written into the corresponding location in the backup array chip 15 via register 18. As data is read out of the primary data arrays via register 33, normal parity checking is done with the data stored in the parity array chips via register 37. If a parity error is detected by the logic at parity check 35 an error signal is sent to the controller 41 and the following steps are processed:

1. The processor controller 41 stops all processing being done by the system.
2. The processor controller then reads out the failing element from the data primary arrays 13A (that scanned from register 33), parity primary arrays 19A (that scanned from register 37), and the corresponding data element in the backup arrays 15 (that from register 39). These data are then compared with the following actions being taken:
   a. If parity is good (good means the correct number of odd or even number of logic "one" bits) between the data primary arrays 13A (from register 33) and the primary parity arrays 19A (that from register 37) then the problem is probably due to an error in the checking logic and the system is returned back to normal operating procedure.
   b. If there is good parity between the backup array 15 (from register 39) and the parity primary arrays 19A (from register 37) then the data primary arrays were bad and the processor controller 41 replaces the data in the data primary arrays 13A with that from the backup array 15. A write enable is provided by the processor controller 41 to array 15 to the control line 41A and the output at the register 39 is scanned through the controller to register 17.
   c. If the backup array 15 equals that in the primary data array 13 at register 37 then the parity array is bad and the processor controller 41 corrects the parity in the parity element by generating a new set of parity bits from the primary data array and scanning that into the register 23 and array 19.
   d. If parity of the primary array 13 data does not equal that in the parity array 19 and the parity of the backup array 15 data does not equal the parity in the array 19 then there is a failure that is unrecoverable in the system.
   e. If the processor controller determines that the failure was in one of the first three, the instruction is retried. If the retry is successful, the operation continues normally.
   f. If the instruction retry is not successful after a given number of attempts (five for example), the problem is probably due to data primary array 13A failure instead of a transient failure. In this case of a permanent failure, the processor controller 41 can switch to the second address space or data secondary array 13B. This is done by a logic level change at latch 31. The latch normally provides a logic zero which via inverters 43 and 44 provides enable logic 1 to the primary address spaces 13A and 19A. When the latch becomes logic 1 the secondary address space 13B only is enabled. In this case, the processor controller 41 must copy all of the data from the backup arrays 15 into the secondary address space 13B on the primary arrays 13. The output at register 39 is then scanned through the controller 41 to the data secondary arrays 13B via register 17. Also, parity must be generated and put in the secondary parity address space 19B called "Parity Secondary". The parity is generated from data in register 39 in the controller and scanned into the secondary parity address space 19B via register 23. At this point, the processor controller can retry the failing instruction.

Figure 3:
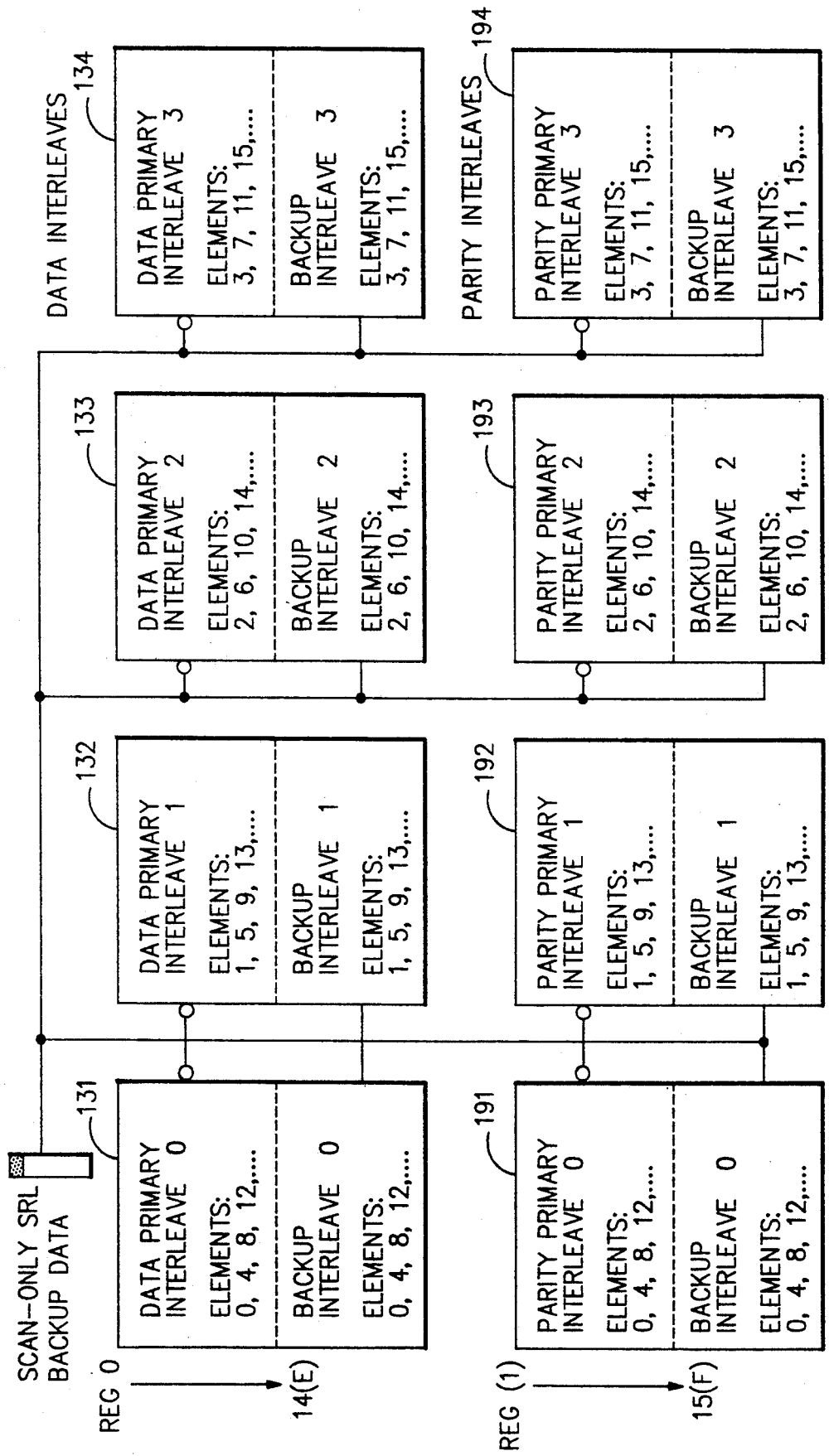
FIG. 3 is a diagram illustrating interleaving of vector processing arrays in accordance with the second embodiment of the present invention where the backup storage is on the same chip as primary arrays.
Figure 4:
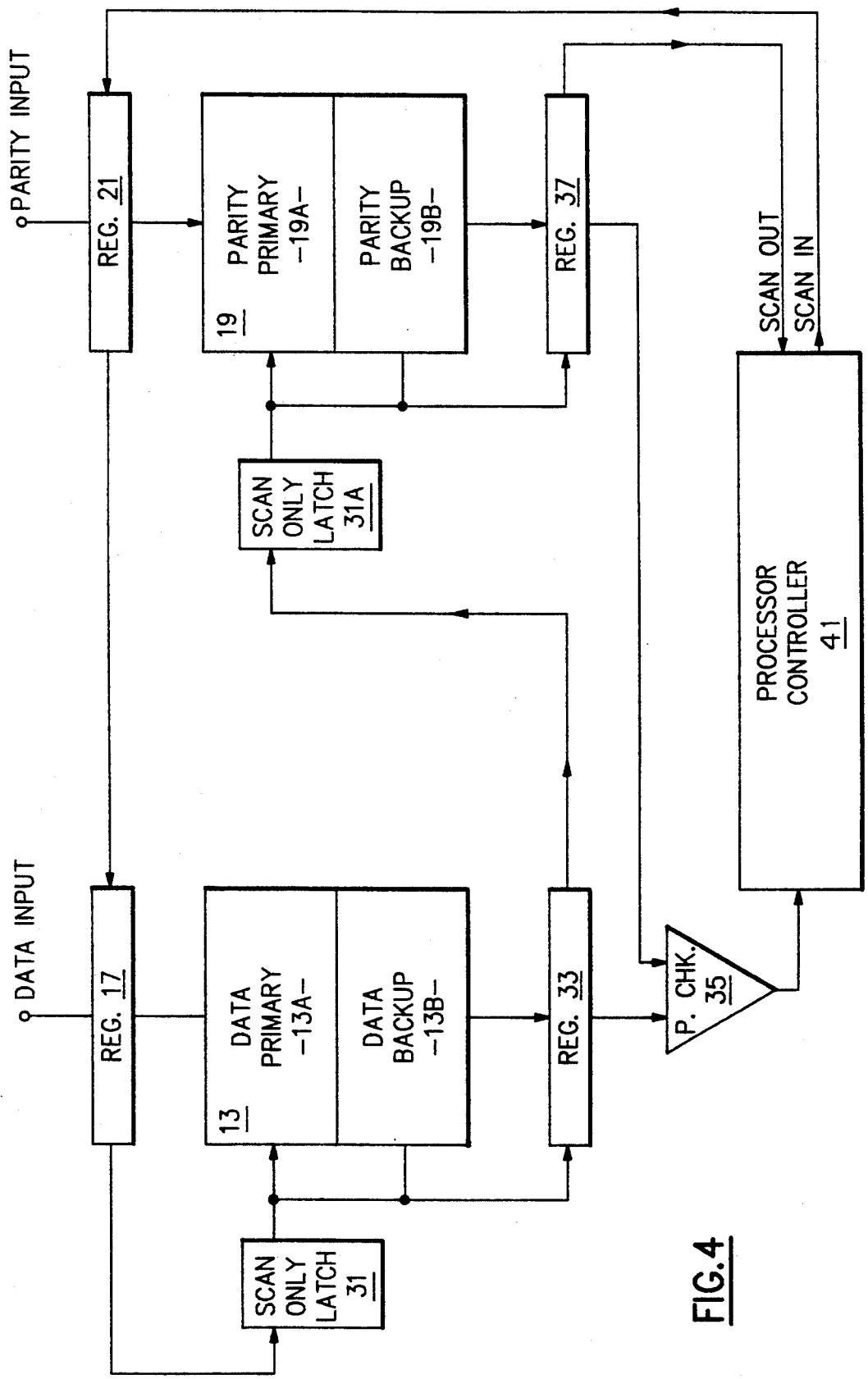
FIG. 4 is a block diagram of the system wherein the backup storage is on the same array chips as primary storage.

In accordance with a second embodiment of the present invention as shown in FIGS. 3 and 4, the "Data Secondary" secondary section 13b of the array chips 131-134 is used for the backup array. Therefore, the backup array uses the second address space of these array chips. The backup data is interleaved in the same manner as the Data Primary and is written simultaneously through the same register (Register 17) as shown in FIG. 4 to both the data primary 13 at address space 13a and backup at address space 13b. Likewise the "Parity Secondary" space contains backup parity and this parity is also interleaved. The parity is applied through Parity-In register 21 to both the parity primary 19a and parity backup 19b.

The parity primary at space 19a and the data primary at space 13a are normally provided out to registers 33 and 37 controlled by the "read" scan line from latches 31 and 31a. If there is a parity error as detected at parity check 35, the processor controller does the comparisons as discussed above comparing data from the data primary, the parity data from the primary parity and the data from the backup. When the data primary is determined to continue to be in error after retries the second address space containing the backup data is then "read" in place of the primary data and likewise when after retries the parity data remains in error the parity backup in the second address space 19b is "read".

Figure 5:
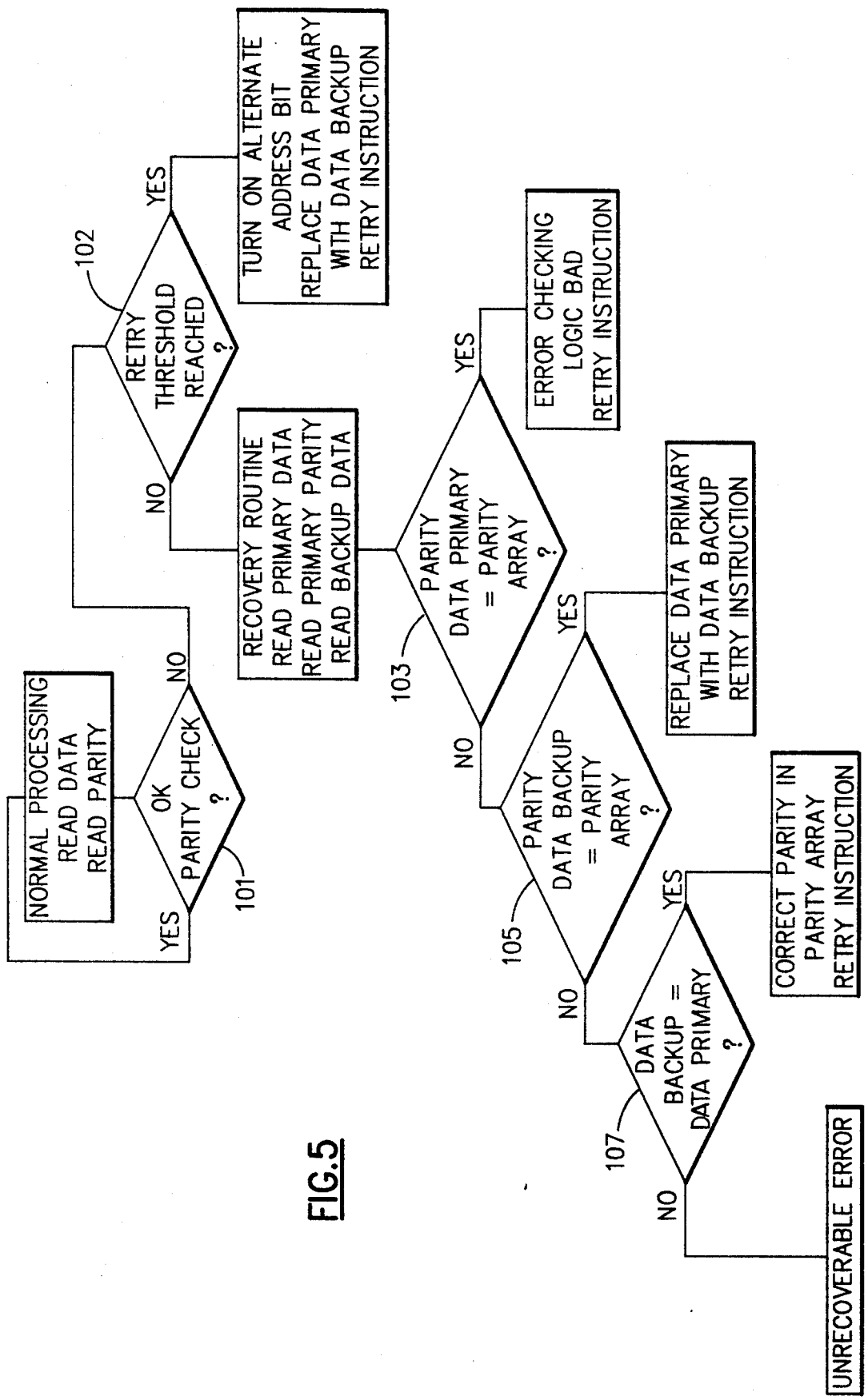
FIG. 5 is a flow chart of the state machine processing performed by the processor controller of FIG. 1.

The processor controller for the system of FIG. 1 or FIG. 4 could be a state machine or a general purpose computer operating under microcode or program control that follows the flowchart of FIG. 5. When the parity check fails as noted at decision block 101 and the retry threshold has not been reached (threshold being after 5 retries) at decision block 102, the recovery routine begins by reading for each element the primary data, the primary parity and the backup data, which data is scanned into registers 41b in the controller 41 (see FIG. 1). If there is good parity for the element, in the primary data array as indicated by "yes" out of the decision block 103 the instruction is retried. If the parity of the element does not agree as indicated by "no" then the element in the backup array 15 is checked for parity with that in the parity array at decision block 105 and if the parity is good the primary data element in the primary data array 13 is replaced with the backup array data element from the backup array 15 and the instruction is retried. The data element in the register 41b that contains the backup array data is scanned into register 17 and a write enable is given which transfers the data from the backup array 15 to the primary data array 13. If the parity of the element in the backup array is not good then the backup data is compared to the primary data as noted by decision block 107. If they are equal then the data in the parity array is corrected. The processor controller 41 generates new parity at generator 41c based on the primary data stored in register in 41b and is scanned into register 23 and when write enable 41a is provided is transferred into the parity array 19. If the decision in block 107 is "no" then the error is unrecoverable.

In a case of all retries, the processor controller 41 reinitializes the main processor and causes it to begin executions at the point it stopped the failure at block 101. If failures continue and the retry threshold of for example five is reached then the program controller 41 activates scan-only latch 31 and forms an element by element copy from the data primary arrays 13A to the data secondary arrays 13B. This is done by first reading each element into registers 33 and 37 and scanning the element out into processor controller registers 41b. The elements, are then scanned into registers 17 and 23 and a write enable 41a is performed which transfers data into secondary arrays. This is repeated until all elements in the data primary array and in the parity primary array are transferred into the data secondary array and the parity secondary array respectively. On an element by element basis when the elements are in registers 41b the above process of decision blocks 103, 105 and 107 is repeated namely that of determining first if there is good parity of the data element in primary data array with that in the parity array and if the answer is "no", the parity of the element in backup array is compared with that of the parity array and if the backup parity element is good then the primary data element is replaced with the backup array data element and if the parity in the backup array is also not good, then the backup data element is compared to the primary data, as in decision block 107, and if they are equal then the data in the parity array is corrected. All this is done on a element by element basis when the elements are placed from the primary data array 13a into the secondary data array 13b and the elements of the parity array is placed in the parity secondary 19b.

Although the invention has been described with reference to preferred embodiments thereof, it will be understood by those skilled in the art that the foregoing and other changes in form and details may be made therein without departing from the spirit and scope of the invention.

We claim:

1. A method for error recovery in primary vector data array register wherein said register includes a plurality of interleaved primary array chips comprising the steps of:
   providing a backup array chip,
   writing data into said primary array chips and at the same time writing identical data into the corresponding location in said backup array chip,
   providing and storing in a plurality of interleaved parity array chips parity for each element stored in said primary array chips,
   as data is read out of said primary array chips, parity checking is done with the data stored in the parity array chips,
   if a parity array error is detected by the logic stopping all processing, comparing and processing the elements from the primary data array chips, the corresponding data element from the backup array chips, and the corresponding parity from the parity array chips as follows:
   if the data in the backup array chips agrees with that in the parity array chips, correcting the element in the primary array chips to correspond with the corresponding element the backup array chips,
   if the backup array data element equals that in the primary array chips, correcting the parity in the parity element, if the failure was one of the last two steps, retrying the instruction, and if the instruction is not successful after a predetermined plurality of attempts, placing a copy of the data from the backup array chips in a second address space of the primary array chips and generating new parity for the parity array chips based on said copy.

2. A method for error recovery in a storage system, said system having a primary data array containing primary data, a parity data array containing parity data associated with said primary data, and a backup data array containing a complete copy of said primary data, said method comprising:

reading requested data from said primary data array and its associated parity data from said parity data array;

checking for a parity error upon said reading of said requested data;

stopping processing if a parity error is detected and performing the following steps;

re-reading said requested data from said primary and parity arrays;

reading a copy of said requested data from said backup data array; and continuing processing if no parity error is detected after said re-read of said requested data.

3. The method of claim 2 further including the steps of:

comparing said copy of said requested data to said associated parity data if a parity error is detected after said re-read of said requested data, said comparison being denoted as a first comparison; and replacing said requested data in said primary data array with said copy if said comparison is valid.

4. The method of claim 3 further including the steps of:

comparing said copy to said requested data from said primary array if said first comparison is not valid, said comparison being denoted as a second comparison; and correcting said associated parity data in said parity data array if said second comparison is valid.

5. A method for error recovery in a storage system, said system having a primary data array containing primary data, a parity data array containing parity data associated with said primary data, and a backup data array containing a complete copy of said primary data, each of said primary data array and said parity data array being divided into a primary address space and a secondary address space, said method comprising:

reading requested data from said primary address space of said primary data array and reading its associated parity data from said primary address space of said parity data array;

checking for a parity error upon said reading of said requested data;

stopping processing if a parity error is detected and performing the following steps;

re-reading said requested data from said primary address spaces of said primary data array and parity data array;

reading a copy of said requested data from said backup data array; and continuing processing if no parity error is detected after said re-read of said requested data.

6. A method according to claim 5 further including the steps of:

repeating, up to a threshold number of times, all of said steps if a parity error is detected after said re-read of said requested data; and repeating said steps using said secondary address space of said primary data array and said secondary address space of said parity data array if said threshold number is reached.

7. A method according to claim 6 further including the step of:

copying said copy of said primary data from said backup data array to said secondary address space of said primary data array before using said secondary address space.

8. A storage system comprising:

a primary data storage for storing data elements;

a parity storage for storing parity for each of said data elements stored in said primary data storage;

a backup storage for storing a complete copy of what is stored in said primary data storage;

input and output registers connected to each of said storages;

a processor controller; and said input and output registers connected in series with said processor controller.

9. The storage system of claim 8 wherein:

said primary storage is located in a first address space on a first plurality of array chips; and said parity storage is located on a second plurality of array chips.

10. The storage system of claim 8 wherein said backup storage is located in a secondary address space of said first plurality of array chips.

11. In a vector processing system including a processor and a processor controller, a vector register system comprising; a primary data array formed on a first plurality of array chips, said primary data array having a primary address space and a secondary address space;

said primary data array containing data elements stored in an interleaved distributed fashion over said plurality of array chips;

a parity data array formed on a second plurality of array chips, said parity data array storing parity data for each of said data elements stored in said primary data array;

a backup data array containing a complete copy of said data elements in said primary data space in said primary array;

a first means for comparing parity of a particular data element in said primary data array and its associated parity in said parity data array;

a second means for comparing parity of a copy of said particular data element in said backup data array and its associated parity in said parity data array;

a third means for replacing said particular data element in said primary data array with said copy of said particular data element from said backup array if a parity error is detected in said first means and no parity error is detected in said second means; and a fourth means for replacing said associated parity if no parity error is detected in said first or second means.

12. The system of claim 11 further comprising a fifth means for copying said copies of said data elements from said backup data array to said second address space of said primary data array.

13. The system of claim 11 wherein said backup data array is formed on a separate array chip.

14. The system of claim 11 wherein said backup data array resides in said second address space on said first plurality array of chips.

* * * * *